(12) United States Patent
Auen et al.

(10) Patent No.: US 8,897,327 B2
(45) Date of Patent: Nov. 25, 2014

(54) LASER DIODE DEVICES

(71) Applicant: OSRAM Opto Semiconductors GmbH, Regensburg (DE)

(72) Inventors: Karsten Auen, Regensburg (DE); Uwe Strauss, Bad Abbach (DE); Thomas Höfer, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 4 days.

(21) Appl. No.: 13/862,787

(22) Filed: Apr. 15, 2013

(65) Prior Publication Data

US 2013/0272329 A1 Oct. 17, 2013

Related U.S. Application Data

(60) Provisional application No. 61/624,427, filed on Apr. 16, 2012.

(51) Int. Cl.
*H01S 3/04* (2006.01)
*H01S 5/024* (2006.01)
*H01S 5/022* (2006.01)
*H01S 5/00* (2006.01)
*H01S 5/42* (2006.01)

(52) U.S. Cl.
CPC ............. *H01S 5/024* (2013.01); *H01S 5/02216* (2013.01); *H01S 5/02248* (2013.01); *H01S 5/02296* (2013.01); *H01S 5/005* (2013.01); *H01S 5/0071* (2013.01); *H01S 5/02469* (2013.01); *H01S 5/42* (2013.01); *H01L 2224/48091* (2013.01)
USPC ............ 372/34; 372/43.01; 372/99; 372/103; 372/108

(58) Field of Classification Search
USPC .................................. 372/34, 43.01, 99, 103
See application file for complete search history.

(56) References Cited

U.S. PATENT DOCUMENTS

| | | | |
|---|---|---|---|
| 6,259,713 | B1 | 7/2001 | Hwu et al. |
| 7,432,132 | B1 | 10/2008 | Rotter et al. |
| 2005/0214979 | A1 | 9/2005 | Suzuki et al. |
| 2006/0139926 | A1 | 6/2006 | Morioka et al. |
| 2008/0225913 | A1 | 9/2008 | Stohr et al. |
| 2010/0246159 | A1 | 9/2010 | Wada |
| 2011/0216793 | A1* | 9/2011 | Gaillard et al. .................. 372/34 |
| 2011/0280266 | A1 | 11/2011 | Hayashi et al. |
| 2012/0039072 | A1 | 2/2012 | Lell et al. |
| 2012/0147913 | A1* | 6/2012 | Ushinsky ......................... 372/34 |

FOREIGN PATENT DOCUMENTS

| | | |
|---|---|---|
| DE | 198 38 518 | 3/2000 |
| DE | 10 2005 036 266 | 1/2007 |
| DE | 10 2007 062 047 | 7/2009 |
| DE | 10 2008 063 634 | 6/2010 |

(Continued)

*Primary Examiner* — Dung Nguyen
(74) *Attorney, Agent, or Firm* — DLA Piper LLP (US)

(57) ABSTRACT

A laser diode device including a housing having a mounting area in a cavity of the housing, at least one laser diode chip that emits electromagnetic radiation through a radiation exit area during operation, at least one covering element which is transmissive, at least in places, to the electromagnetic radiation generated by the laser diode chip during operation, and a deflection element, that directs at least part of the electromagnetic radiation generated by the laser diode chip during operation in a direction of the covering element, wherein the radiation exit area of the laser diode chip runs substantially transversely or substantially perpendicularly with respect to the mounting area and/or with respect to the covering element, the covering element connects to the housing, and the covering element tightly closes the housing.

20 Claims, 4 Drawing Sheets

(56) References Cited

FOREIGN PATENT DOCUMENTS

| | | |
|---|---|---|
| DE | 10 2010 012 604 | 9/2011 |
| EP | 1 478 017 | 11/2004 |
| EP | 1 710 619 | 10/2006 |
| WO | 2004/107511 A2 | 12/2004 |
| WO | 2010/069282 A2 | 6/2010 |

* cited by examiner

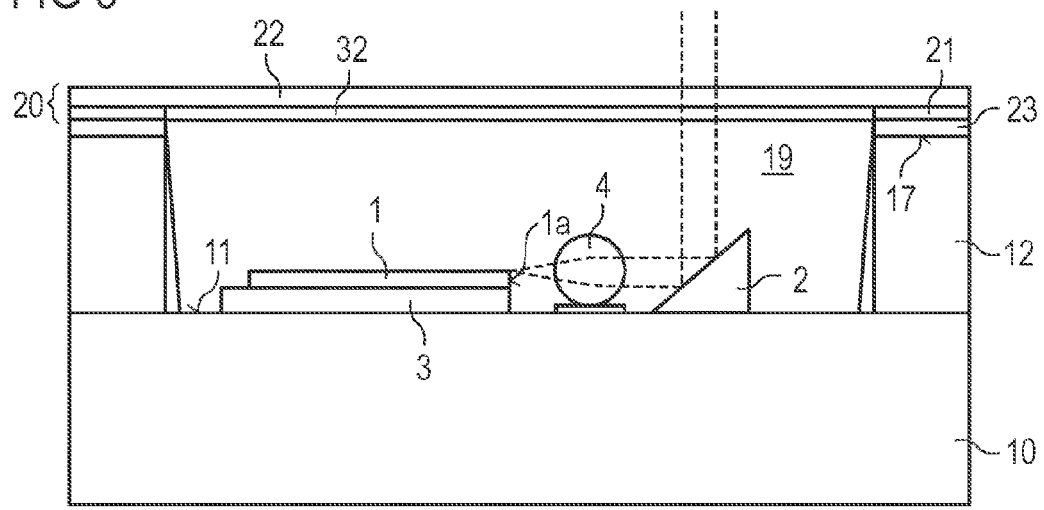
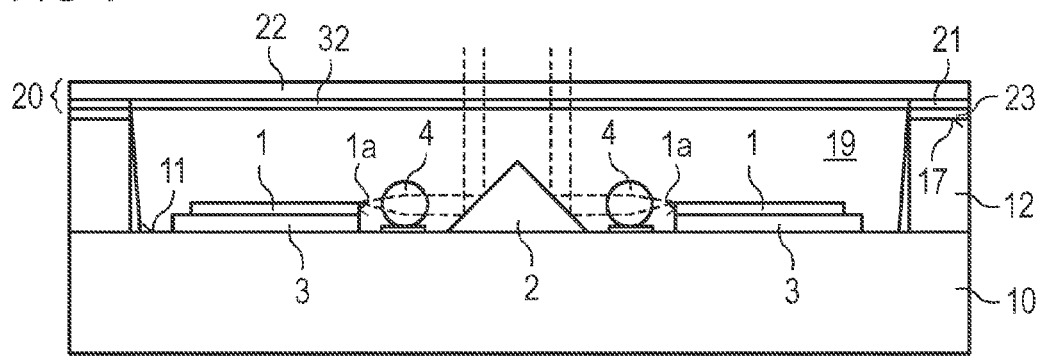

LASER DIODE DEVICES

TECHNICAL FIELD

This disclosure relates to laser diode devices.

BACKGROUND

WO 2004/107511 A2 and WO 2010/069282 A2 describe laser diode devices. There is a need, however, to provide laser diode devices which have a particularly high optical output power.

SUMMARY

We provide a laser diode device including a housing having a mounting area in a cavity of the housing, at least one laser diode chip that emits electromagnetic radiation through a radiation exit area during operation, at least one covering element which is transmissive, at least in places, to the electromagnetic radiation generated by the laser diode chip during operation, and a deflection element, that directs at least part of the electromagnetic radiation generated by the laser diode chip during operation in a direction of the covering element, wherein the radiation exit area of the laser diode chip runs substantially transversely or substantially perpendicularly with respect to the mounting area and/or with respect to the covering element, the covering element connects to the housing, and the covering element tightly closes the housing.

BRIEF DESCRIPTION OF THE DRAWINGS

FIGS. 2, 3, 4, 5 and 6 show schematic sectional illustrations of further examples of our laser diode devices.

DETAILED DESCRIPTION

Figure 1A:
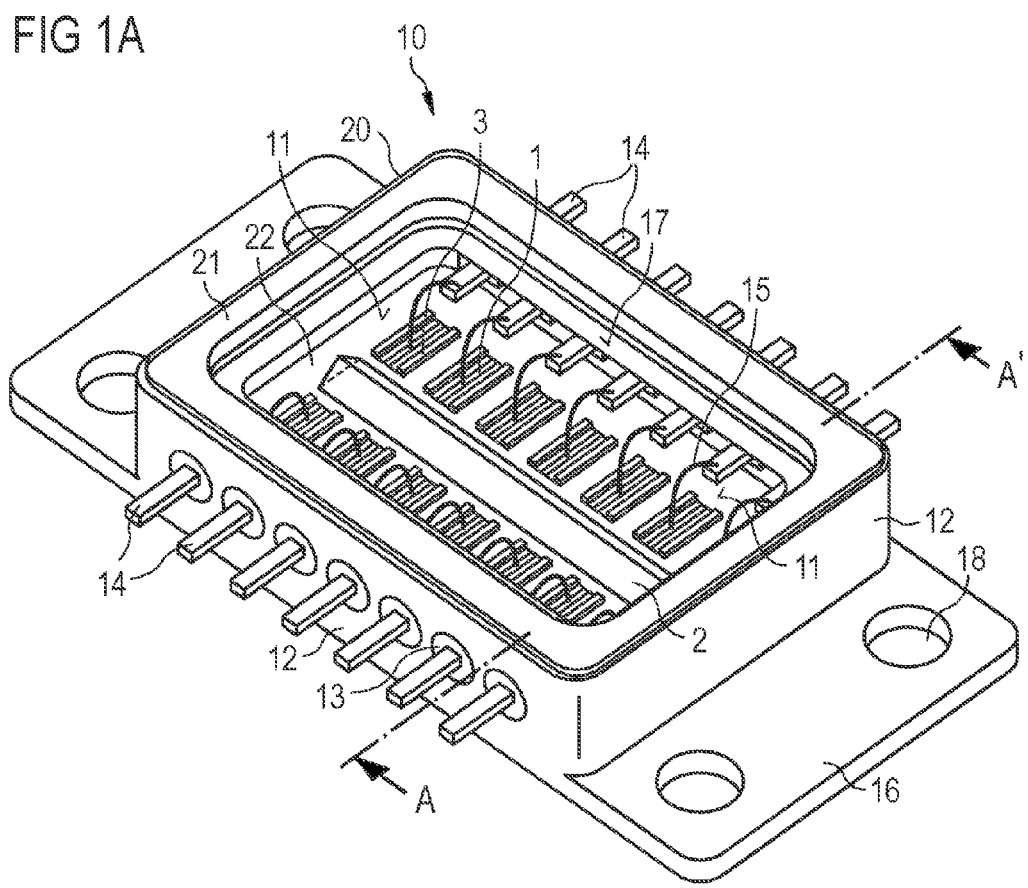
FIG. 1A shows a schematic perspective illustration of a first example of one of our laser diode devices.

It will be appreciated that the following description is intended to refer to specific examples of structure selected for illustration in the drawings and is not intended to define or limit the disclosure, other than in the appended claims.

Our laser diode device may comprise a housing. The components of the laser diode device can be arranged in the housing.

The housing has a cavity. The cavity can be, for example, a recess, a cutout or the like in a main body of the housing. The cavity of the housing is delimited at its bottom area by a mounting area of the housing. The mounting area is provided to fix components of the laser diode device to it. Besides the bottom area, the cavity can also be delimited by side areas running substantially perpendicularly or obliquely with respect to the mounting area of the cavity. The cavity of the housing is designed to receive the components of the laser diode device.

The laser diode device may comprise a laser diode chip which emits electromagnetic radiation through a radiation exit area during operation. The laser diode chip is designed in particular to emit electromagnetic radiation in the spectral range between UV radiation and infrared radiation during operation. By way of example, the laser diode chip can be designed to emit UV radiation, blue light, green light, red tight or infrared radiation during operation. In particular, the laser diode chip may be a laser diode chip based on a nitride compound semiconductor material.

"Based on nitride compound semiconductor material" means that a semiconductor layer sequence of the laser diode chip or at least one part thereof, particularly preferably at least one active zone and/or a growth substrate wafer, comprises or consists of a nitride compound semiconductor material, preferably $Al_nGa_mIn_{1-n-m}$, where $0 \leq n \leq 1$, $0 \leq m \leq 1$ and $n+m \leq 1$. In this case, this material need not necessarily have a mathematically exact composition according to the above formula. Rather, it can comprise, for example, one or more dopants and additional constituents. For the sake of simplicity, however, the above formula includes only essential constituents of the crystal lattice (Al, Ga, In, N), even if these can be replaced and/or supplemented in part by small amounts of further substances.

The laser diode chip can compose in particular an epitaxially grown semiconductor layer sequence comprising an active layer formed, for example, on the basis of AlGaInN and/or InGaN. The active layer is then designed to emit electromagnetic radiation from the spectral range from ultraviolet radiation through to green light during operation. The laser diode chip can comprise as active layer, for example, a conventional pn junction, a double heterostructure or a quantum well structure, particularly preferably a multiquantum well structure. In this case, the designation quantum well structure does not exhibit any significance with regard to the dimensionality of the quantization. It therefore encompasses inter alia quantum wells, quantum wires and quantum dots and any combination of these structures.

The laser diode chip in this case is distinguished in particular by a high optical output power. By way of example, the optical output power of the laser diode chip is at least about 1 W, in particular at least about 3 W.

The laser diode chip comprises a radiation exit area. The radiation exit area is that area of the laser diode chip through which at least a large part of the radiation emitted during the operation of the laser diode chip leaves the laser diode chip. The radiation exit area is formed, for example, by the part of a side area of the semiconductor layer sequence. The laser diode chip is then in particular an edge emitting laser diode chip.

The laser diode device may comprise a covering element which is transmissive, at least in places, to the electromagnetic radiation generated by the laser diode chip during operation. That is to say that the radiation generated by the laser diode chip during operation leaves the laser diode device through the covering element, preferably exclusively through the covering element. In this case, the covering element can have regions transmissive to the electromagnetic radiation generated by the laser diode chip during operation, and regions not transmissive to the radiation.

The laser diode device may comprise a deflection element which directs at least part of the electromagnetic radiation generated by the laser diode chip during operation in the direction of the covering element. The electromagnetic radiation emerges, for example, from the radiation exit area of the laser diode chip and subsequently impinges on the deflection element. The radiation is guided by the deflection element to the covering element by optical refraction and/or reflection. That is to say that the deflection element changes the main emission direction of the electromagnetic radiation generated by the laser diode chip during operation, for example by an angle of about between 80° to about 100°.

The radiation exit area of the laser diode chip may run substantially transversely or substantially perpendicularly with respect to the mounting area and/or with respect to the covering element. In other words, the laser diode chip emits its radiation such that the radiation runs partly parallel to the mounting area and/or to the main extension plane of the covering element. Furthermore, part of the radiation generated by the laser diode chip during operation runs such that in continuation the radiation intercepts the plane of the mounting area. In particular, the radiation exit area of the laser diode chip is not arranged parallel to the mounting area. The electromagnetic radiation generated by the laser diode chip during operation, directly at the radiation exit area, is not directed by the mounting area, for example, in the direction of the covering element. Rather, at least a large part of the radiation is deflected in the direction of the covering element by the deflection element of the laser diode device, the deflection element being arranged at a distance from the radiation exit area.

The covering element may connect to the housing. By way of example, the covering element is situated at a distance from the mounting area. The covering element, that is to say its main extension plane, can then run parallel to the mounting area of the housing at least in places. The covering element closes off the housing, for example, at its top side.

The covering element may tightly close the housing. In particular, the covering element may tightly close the housing against atmospheric gases and/or moisture. In the context of the production possibilities, the covering element closes the housing in particular hermetically. That is to say that the covering element completely covers, for example, the cavity of the housing and closes the cavity and thus the components of the laser diode device in the cavity, such as, for example, the laser diode chip and the deflection element, tightly relative to the surroundings. In this case, the cavity can also be filled with a protective gas, for example, a noble gas which is prevented from emerging from the cavity by the covering element tightly closing the housing. Alternatively, it is possible for the cavity to be evacuated.

In particular, the housing is preferably tightly closed such that the leakage rate for entering gas or exiting gas is at most $5*10^{(-8)}$ Pa m$^{(3)}$/s.

The laser diode device may comprise a housing having a mounting area in a cavity of the housing. Furthermore, the laser diode device may comprise at least one laser diode chip that emits electromagnetic radiation through a radiation exit area during operation. Furthermore, the laser diode device may comprise at least one covering element transmissive, at least in places, to the electromagnetic radiation generated by the laser diode chip during operation. The laser diode device may furthermore comprise a deflection element which directs at least part of the electromagnetic radiation generated by the laser diode chip during operation in the direction of the covering element, wherein the radiation exit area of the laser diode chip runs substantially transversely or substantially perpendicularly with respect to the mounting area and/or with respect to the covering element, the covering element connects to the housing, and the covering element tightly closes the housing.

The laser diode device may comprise at least two, preferably a multiplicity of laser diode chips. In this case, the laser diode chips can be of an identical type. That is to say that the laser diode device may then comprise, for example, exclusively structurally identical laser diode chips. By virtue of the laser diode chips being mounted on the mounting area of the housing, the laser diode chips can be thermally linked to the housing very well. Efficient dissipation of heat generated during operation is thus possible.

In conventional laser diode devices comprising a TO housing, for example, the problem arises of relatively poor thermal linking of the laser diode chip to the housing and thus to the surroundings. If, by way of example, two laser diode chips having a high optical output power of at least 1 W are mounted in such a TO housing, then they exhibit a poorer optical output power than a single one of the laser diode chips since the two laser diode chips mutually neat one another to such a great extent that the electro-optical efficiency decreases more than proportionally.

One solution to this problem might consist in the use of housings such as are used, for example, for high-power light emitting diodes. In the case of these housings, however, it is necessary to encapsulate the laser diode chip with a plastic by injection molding. Therefore, these housings are not suitable for laser diode chips having a high optical output power since the plastics do not withstand the optical power densities and/or the short wavelengths of the radiation generated by the laser diode chip during operation. Furthermore, with such plastics it is not possible to tightly close the laser diode chips in the housings.

The at least one laser diode chip need not be potted. That is to say that the cavity of the housing need not be filled with a potting material, for example, with a plastic rather in particular the radiation exit area of the laser diode chip may adjoin the gas filling the cavity of the housing, for example, a protective gas or air. Furthermore, it is possible for the housing overall to be free of a plastic material and to be formed, for example, with metallic and/or ceramic materials.

The covering element may have an enclosure which encloses a window element in a frame-like manner. In this case, the enclosure may be formed with is different material from the window element. By way of example, the enclosure may be formed with a material not transmissive to the electromagnetic radiation generated by the at least one laser diode chip during operation. By contrast, the window element may be formed with a material transmissive at least to part of the electromagnetic radiation generated by the laser diode chip during operation. In this case, the enclosure can be formed, for example, with a metal such as high-grade steel. The window element may be formed with a radiation-transmissive material. By way of example, the material of the window element may comprise one of the following materials or consists of one of the following materials: glass, sapphire, ceramic or the like. In this case, the window element can be transparent, pellucid or translucent in a milky fashion.

Furthermore, it is possible for at least one further material such as, for example, a luminescence conversion material or a radiation-scattering material to be introduced into the basic material of the window element. In this case, the window element can have radiation-scattering or radiation-converting properties.

The enclosure may be connected to the housing by soldering or welding. By way of example, the housing can be formed with a metal at least in the region in which it adjoins the covering element. In this case, it is possible for the enclosure and housing to be connected by welding. This makes possible a particularly thermally stable and tight connection between the two elements. Alternatively, it is possible for the covering element and the housing to be connected to one another by soldering, wherein a metallic solder or a glass solder can be used as a connector.

At least one of the following optical elements may be fixed to the covering element: luminescence conversion element, lens or diffusing element. In this case, it is possible, in particular, for a plurality of the elements to be fixed to the covering element. In this case, the elements can be fixed both at that side of the covering element facing the at least one laser diode chip, and at that side of the covering element facing away from the at least one laser diode chip. The elements can be fixed to the covering element directly or indirectly. By way of example, a luminescence conversion element can be arranged at that side of the covering element facing away from the laser diode chip, a lens being arranged in turn on the luminescence conversion element. The lens may then be fixed to the covering element indirectly, whereas the luminescence conversion element may be fixed to the covering element directly.

In a case where the covering element comprises a luminescence conversion material and/or a luminescence conversion element is fixed to the covering element, the laser diode device can be designed to generate white light during operation. By way of example, the at least one laser diode chip generates blue light or UV radiation in this case. The luminescence conversion material and/or the luminescence conversion element converts at least part of the light into electromagnetic radiation having higher wavelengths.

In accordance with at least one embodiment of the laser diode device, the deflection element is formed by one of the following optical elements or comprises at least one of the following optical elements: mirror, prism or the like. That is to say that deflection of the electromagnetic radiation generated by the at least one laser diode chip during operation in the direction of the covering element can be effected by reflection and/or optical refraction.

The laser diode device may comprise at least one heat-conducting element arranged between the mounting area of the housing and the at least one laser diode chip. The heat-conducting element can serve, in particular, to expand or spread the heat flow generated during operation of the laser diode chip between the laser diode chip and the mounting area to achieve a large transition area during heat transfer from the laser diode chip into the housing. The housing can then be mounted by its side facing away from the mounting area directly on a heat sink. In this way, a particularly short path distance between laser diode chip and heat sink is made possible such that the heat from the laser diode chip can be effectively dissipated. The use of the heat-conducting element then ensures that the heat generated by the laser diode chip can be distributed over a particularly large area. It is thus also possible to use a plurality of laser diode chips in the housing without the thermal linking of the individual laser diode chips thereby being significantly impaired. In particular, the mutual heating of the laser diode chips can be reduced in this way.

The heat-conducting element can furthermore be used to reduce or compensate for thermal strains between the laser diode chip and the housing which are caused, for example, by different coefficients of thermal expansion. The heat-conducting element can be fixed to the laser diode chip and the mounting area, for example, by soldering.

The heat-conducting element can in particular be formed by at least one of the following materials or consist of one of the following materials: silicon carbide, boron nitride, copper-tungsten, diamond, aluminum nitride or the like.

Furthermore, it is possible for the heat-conducting element to be formed with an electrically conductive material and for the laser diode chip to be electrically connected by the heat-conducting element.

The laser diode device may comprise at least two laser diode chips, wherein a heat-conducting element is assigned one-to-one to each laser diode chip. That is to say that, in this case, not all of the laser diode chips are arranged on a common heat-conducting element. Rather, each laser diode chip may be arranged on its own heat-conducting element. In this case, already prior to mounting in the cavity of the housing, the laser diode chips can be fixed on the heat-conducting element assigned thereto and can be fixed as a composite assembly of laser diode chip and heat-conducting element on the mounting area.

The housing may be formed with a metallic material. By way of example, the housing comprises a housing main body consisting of a metallic material. Thus, the housing can comprise, for example, a housing main body consisting of an FeNiCo alloy and/or a WCu alloy. The housing main body can be covered or covered in places with a metallic layer, for example, composed of Ni/Au or Au. The housing can in this case be a housing which is similar to a so-called "butterfly" housing. In a departure from conventional butterfly housings, however, our housings may have a covering element which closes off the housing cavity at a housing top side and is formed with a material which is radiation-transmissive at least in places.

The housing may have at least one side wall. The side wall or the side walls delimit the housing in a lateral direction running, for example, parallel to the mounting area. The side wall of the housing runs substantially obliquely or substantially perpendicularly with respect to the mounting area. By way of example, the side wall of the housing connects the mounting area to the covering element. In particular, the covering element can be fixed at that side of the side wall facing away from the mounting area.

The side wall may have at least one opening through which is led an electrical connection element, to which the laser diode chip electrically conductively connects. For the case where the housing and thus also the side wall is formed with a metallic material, the electrical connection element led through the opening into the cavity of the housing may be fixed in the opening of the side wall in an electrically insulating manner.

In this case, the electrical connection element may be formed, for example, as a pin composed of an electrically conductive material, for example, a metal which projects from outside of the housing through the opening into the cavity of the housing. In the housing cavity, the connection element can then be electrically conductively connected to a laser diode chip, for example, by a connecting wire.

In this case, it is possible, in particular, for the number of connection elements to correspond at least to the number of laser diode chips. By way of example, each laser diode chip is electrically conductively connected to exactly one connection element. The laser diode device can then comprise, for example, ten, twelve, fourteen or more connection elements and an identical number of laser diode chips. However, it is also possible for the laser diode chips to be interconnected in series within the housing, and then for only two connection elements to be required for a plurality of laser diode chips such that the number of connection elements is less man the number of laser diode chips.

A beam shaping optical element may be arranged between the radiation exit area of the at least one laser diode chip and the deflection element. The beam shaping optical element can be, for example, a lens such as a cylindrical lens. Furthermore, a plurality of beam shaping optical elements can be arranged between the radiation exit area and the deflection element, the electromagnetic radiation emitted by the laser diode chip during operation passing through the beam shaping optical elements in turn. The deflection element or deflection elements can be used, for example, for slow axis and/or fast axis collimation of the laser radiation. In this way, it is possible to arrange a plurality of laser diode chips relatively close to one another in the housing of the laser diode device, without the beam lobes of the individual laser diode chips being superimposed within the housing.

If a diffusing element or a luminescence conversion element is used at the covering element, then a particularly uniform illumination of the element is desirable. In this case, it proves to be advantageous if the beam lobes are superimposed at least at the element in each case at their full width at half maximum. If the beam lobes are intended to be guided individually outside the housing, then the beam lobes should be superimposed by not more than 10% at least upon emerging from the housing.

All components of the laser diode device, insofar as they are present, that is to say that the at least one laser diode chip, the at least one deflection element, and the at least one beam shaping optical element, can be fixed to the mounting area of the housing. The deflection element and the beam shaping optical element can be fixed to the mounting area by adhesive bonding, for example.

The laser diode device may comprise at least two laser diode chips, wherein the radiation exit areas of two of the laser diode chips face one another, and at least one deflection element is arranged between the two laser diode chips. The deflection element may therefore be arranged between two laser diode chips facing one another. In this case, the deflection element may be configured such that laser radiation from one of the laser diode chips cannot pass to the other of the laser diode chips.

The optically active areas of the deflection element are arranged, for example, axially symmetrically with respect to a center axis relative to which the laser diode chips are also arranged axially symmetrically on both sides of the deflection element. By way of example, the laser diode device in this case comprises a single deflection element extending along the center axis. To the left and right of the deflection element, the laser diode chips can then be arranged axially symmetrically or in a manner offset with respect to one another.

The laser diode device described here will be explained in greater detail below on the basis of selected, representative examples and the associated figures.

Elements which are identical, of identical type or act identically are provided with the same reference signs in the figures. The figures and the size relationships of the elements illustrated in the figures among one another should not be regarded as to scale. Rather, individual elements may be illustrated with an exaggerated size to enable better illustration and/or for a better understanding.

Figure 1B:
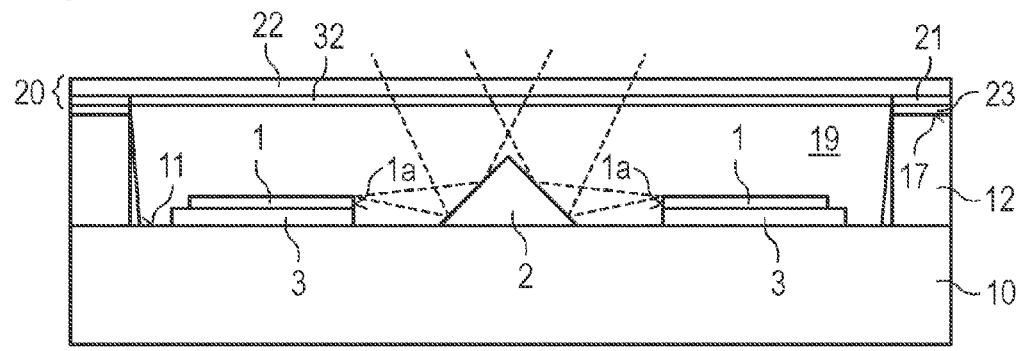
FIG. 1B shows an associated schematic sectional illustration.

FIG. 1A shows a first example of a laser diode device. FIG. 1B shows an associated sectional illustration along the sectional line A-A'.

The laser diode device comprises a housing 10. The housing 10 is formed with a metal. The housing 10 has a cavity 19 in which the components of the laser diode device are arranged.

Fourteen nitride-based laser diode chips 1 are fixed in the cavity 19 of the housing 10 on the mounting area 11 of the housing. A respective heat-conducting element 3 is arranged between the mounting area 11 and the laser diode chips 1, wherein a heat-conducting element 3 is assigned one-to-one to each laser diode chip 1.

The laser diode chips 1 each have radiation exit areas 1a through which electromagnetic radiation generated during operation leaves the laser diode chips 1. The laser diode chips 1 are arranged in two series on both sides of a single optical deflection element 2. The optical deflection element 2 is a deflection mirror having two reflectively coated areas respectively facing the radiation exit areas 1a of the laser diode chips 1. The radiation generated by the laser diode chips 1 during operation is reflected from the optical deflection element 2 toward a covering element 20.

The laser diode chips 1 can be fixed to the heat-conducting element 3 by a solder material. The heat-conducting element 3 in turn is fixed at its side facing away from the assigned laser diode chip 1 to the mounting area 11 in each case by a solder material.

The housing 10 has side walls 12 which delimit the cavity 19 in which the components of the laser diode device are arranged in a lateral direction.

The housing 10 is integral and has, in addition to the mounting area 11 and the side walls 12, a fixing device 16, which is a projection at two sides of the housing. The fixing device 16 can have perforations 18 by which the housing 10 is arranged and fixed, for example, by screwing or riveting to a heat sink (not illustrated) at the underside of the housing 10 facing away from the mounting area 11.

The housing wall 12 has a multiplicity of openings 13. Through each opening 13, a connection element 14 is led from outside the housing into the housing cavity. The connection elements 14 are metallic pins fixed in the housing wall in an electrically insulating manner. That is to say that the connection elements are in each case electrically insulated from the housing 10.

Each connection element 14 electrically conductively connects to an assigned laser diode chip 1 in the housing cavity 19 by a connecting wire 15. The laser diode chips 1 in the housing cavity 19 can be individually driven via the connection elements 14.

At a distance from the mounting area 11, the housing cavity 19 is covered by the covering element 20. The covering element 20 comprises an enclosure 21 consisting of a metallic material. The enclosure 21 surrounds a window element 22. The enclosure 21 is non-transmissive to the electromagnetic radiation generated by the laser diode chips 1 during operation. The radiation can leave the housing 10 only through the window element 22. The window element 22 is formed with glass, for example.

The enclosure 21 connects to the side walls 12 of the housing at a bearing area 17 which delimits the side walls 12 at the top side of the housing in a connecting region 23. The connection can be effected, for example, by a metallic solder, a glass solder, or a welding connection, wherein the connecting region 23 is then configured accordingly.

A diffusing element 32 is optionally arranged at that side of the covering element 20 facing the light emitting diode chips 1, the diffusing element being provided to diffusely scatter the electromagnetic radiation generated by the laser diode chips 1 during operation. In this way, it is possible for the electromagnetic radiation, upon emerging from the covering element 20, to be distributed homogeneously over the area of the window element 22 and to emerge uniformly from the housing 10.

The covering element 20 tightly closes off the housing. In particular, the housing can be hermetically tightly closed such that the laser diode chips 1 are protected against atmospheric gases and moisture.

The housing 10 can be a type of butterfly housing, wherein, in contrast to conventional housings of this type, the covering element 20 at the top side of the housing is radiation-transmissive.

The heat generated in the laser diode chip 1 during operation is spread by the heat-conducting element 3, which heat can therefore be dissipated over a large area to the mounting area 11 of the housing 10. From there, the heat is dissipated to the surroundings via a relatively short heat-conducting path. In this way, it is possible to arrange a multiplicity of laser diode chips in a single housing without the efficiency of the individual laser diode chip being reduced to an excessively great extent by the waste heat of the surrounded laser diode chips.

A laser diode device is thus specified which can have an optical output power of a number of watts, wherein the optical output power is scaleable by enlarging the housing and adding further laser diode chips in a simple manner.

Figure 2:
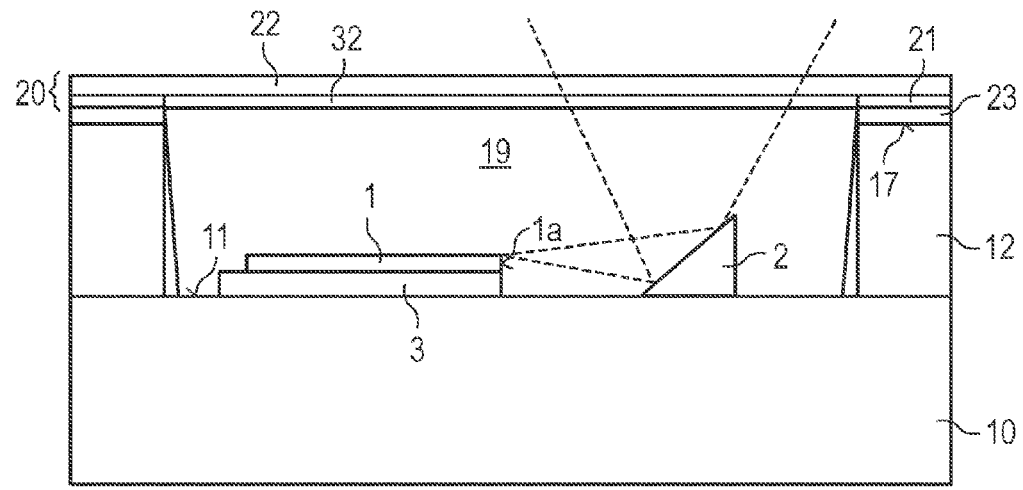

In contrast to the example in FIGS. 1A and 1B, the schematic sectional illustration in FIG. 2 shows an example in which laser diode chips are arranged in a single series alongside one another in the housing. The emitted light is reflected from the single deflection element, a deflection mirror, to the covering element 20.

In conjunction with FIG. 3, an example is illustrated wherein a beam shaping optical element 4, a cylindrical lens, is arranged between the radiation exit area 1a of the laser diode chips 1 and the deflection element 2. The beam shaping optical element 4 in this case collimates the radiation. In this way, the laser diode chips 1 can be arranged as close to one another as possible without the beam lobes of the individual laser diode chips already being superimposed within the housing.

In conjunction with FIG. 4, an example is illustrated wherein the example from FIGS. 1A and 1B is supplemented by the beam shaping optical elements 4 from the example from FIG. 3. In this case, the beam shaping optical elements 4 are respectively arranged between the radiation exit areas 1a and the deflection element 2. The beam shaping optical elements 4 can extend parallel to the deflection element 2 on both sides thereof. In this way, a particularly space-saving arrangement of the laser diode chips 1 in the housing is possible, without the beam lobes of the individual laser diode chips being superimposed within the housing.

Figure 5:
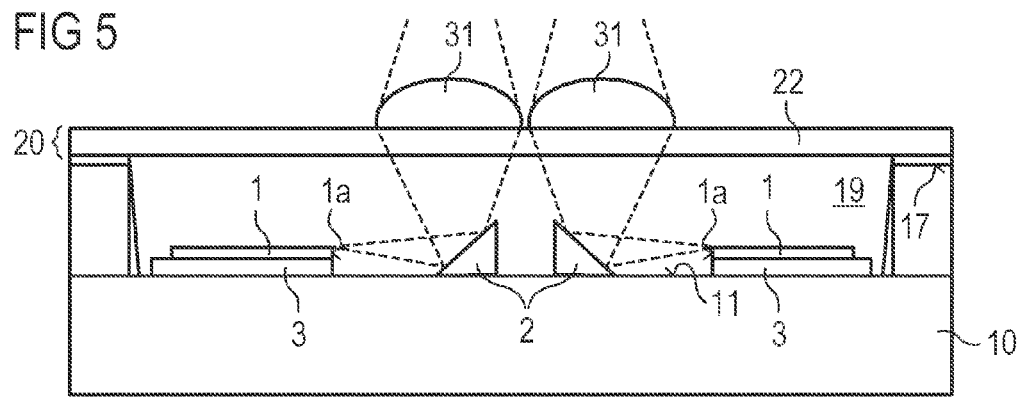

In conjunction with FIG. 5, on the basis of a schematic sectional illustration, an example is shown wherein, in contrast to the example in FIGS. 1A and 1B, each of the two series of laser diode chips 1 is assigned a dedicated optical deflection element 2. Optical elements, i.e. lenses 31, which provide for beam shaping outside the housing, are arranged at that side of the covering element 20 facing away from the laser diode chips 1. The diffusing element 32 is dispensed with in this case.

Figure 6:
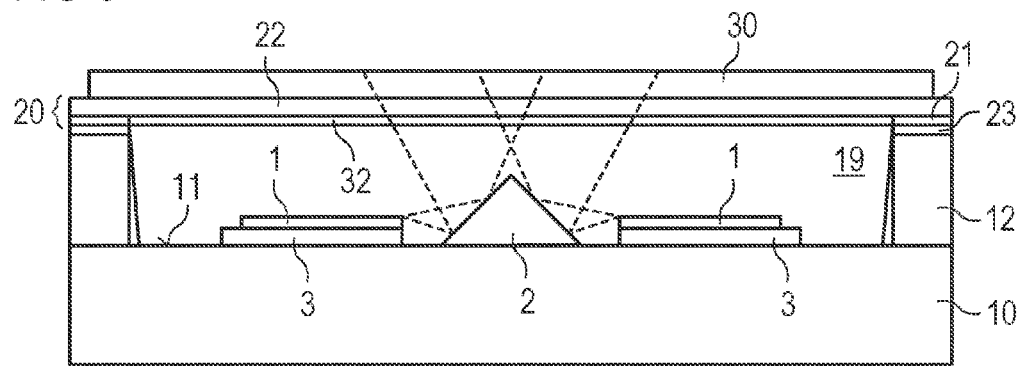

In conjunction with FIG. 6, on the basis of a schematic sectional illustration, an example is explained in greater detail wherein a luminescence conversion element 30 is arranged at the outer side of the covering element 20 facing away from the laser diode chips 1. Such a luminescence conversion element 30 can, for example, also be present in the examples in FIGS. 1A, 1B, 2, 3 and 4. By way of the luminescence conversion element 30 it is possible, for example, for the laser diode device to be designed to emit white light which is, for example, mixed light composed of as converted portion of the electromagnetic radiation generated by the laser diode chips 1 during operation and the electromagnetic radiation generated during operation.

Our laser diode devices are not restricted to the examples by the description. Rather, this disclosure encompasses any novel feature and also any combination of features, which in particular includes any combination of features in the appended claims, even if the feature or combination itself is not explicitly specified in the claims or examples.

The invention claimed is:

1. A laser diode device comprising:
a housing having a mounting area in a cavity of the housing,
at least one laser diode chip that emits electromagnetic radiation through a radiation exit area during operation,
at least one covering element which is transmissive, at least in places, to the electromagnetic radiation generated by the laser diode chip during operation, and
a deflection element, that directs at least part of the electromagnetic radiation generated by the laser diode chip during operation in a direction of the covering element,
wherein the radiation exit area of the laser diode chip runs substantially transversely or substantially perpendicularly with respect to the mounting area and/or with respect to the covering element,
the covering element connects to the housing and tightly closes the housing such that a leakage rate is at most $5*10^{(-8)}$ (Pa*m^3)/s.

2. The laser diode device according to claim 1, wherein the at least one laser diode chip is not potted.

3. The laser diode device according to claim 1, wherein the covering element has an enclosure surrounding a window element in a frame-like manner, and the window element is transmissive at least to part of the electromagnetic radiation generated by the laser diode chip during operation.

4. The laser diode device according to claim 3, wherein the enclosure is formed with a metal and the window element comprises at least one of or consists of at least one of glass, sapphire and ceramic.

5. The laser diode device according to claim 3, wherein the enclosure connects to the housing by soldering or welding.

6. The laser diode device according to claim 1, wherein at least one optical element of luminescence conversion element, lens or diffusing element is fixed to the covering element.

7. The laser diode device according to claim 1, wherein the deflection element is formed by one of or comprises one of a mirror or a prism.

8. The laser diode device according to claim 1, further comprising at least one heat-conducting element arranged between the mounting area and the at least one laser diode chip.

9. The laser diode device according to claim 8, wherein a heat-conducting element is assigned one-to-one to each laser diode chip.

10. The laser diode device according to claim 1, wherein the housing is formed with a metallic material.

11. The laser diode device according to claim 1, wherein the housing has at least one side wall which runs substantially obliquely or substantially perpendicularly with respect to the mounting area, and the side wall has at least one opening through which is led an electrical connection element to which the laser diode chip is electrically conductively connected.

12. The laser diode device according to claim 1, wherein a beam shaping optical element is arranged between the radiation exit area of the at least one laser diode chip and the deflection element.

13. The laser diode device according to claim 1, further comprising at least two laser diode chips, wherein radiation exit areas of two of the laser diode chips face one another and at least one deflection element is arranged between the two radiation exit areas.

14. The laser diode device according to claim 13, comprising exactly one deflection element.

15. Laser diode device comprising:
a housing having a mounting area in a cavity of the housing,
at least two laser diode chips which emit electromagnetic radiation through a radiation exit area during operation,
at least one covering element which is transmissive, at least in places, to the electromagnetic radiation generated by the laser diode chips during operation,
a deflection element, which directs at least part of the electromagnetic radiation generated by the laser diode chips during operation in the direction of the covering element,
the radiation exit areas of the laser diode chips run transversely or perpendicularly with respect to the mounting area and/or with respect to the covering element,
the covering element is connected to the housing, and
the covering element tightly closes the housing,
wherein the radiation exit areas of two of the laser diode chips face one another and at least one deflection element is arranged between the two radiation exit areas.

16. The laser diode device according to claim 2, wherein the covering element has an enclosure surrounding a window element in a frame-like manner, and the window element is transmissive at least to part of the electromagnetic radiation generated by the laser diode chip during operation.

17. The laser diode device according to claim 15, wherein the covering element has an enclosure surrounding a window element in a frame-like manner, and the window element is transmissive at least to part of the electromagnetic radiation generated by the laser diode chip during operation.

18. The laser diode device according to claim 15, wherein the covering element tightly closes the housing such that a leakage rate is at most $5*10^{-8}$ (Pa*m^3)/s.

19. The laser diode device according to claim 15, comprising exactly one deflection element.

20. The laser diode device according to claim 15, wherein a heat-conducting element is assigned one-to-one to each laser diode chip.

* * * * *